(12) United States Patent
Lanois

(10) Patent No.: US 11,239,376 B2
(45) Date of Patent: Feb. 1, 2022

(54) DIODE STRUCTURE

(71) Applicant: STMICROELECTRONICS (TOURS) SAS, Tours (FR)

(72) Inventor: Frederic Lanois, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 195 days.

(21) Appl. No.: 16/584,774

(22) Filed: Sep. 26, 2019

(65) Prior Publication Data
US 2020/0105946 A1 Apr. 2, 2020

(30) Foreign Application Priority Data
Sep. 28, 2018 (FR) ...................................... 1858933

(51) Int. Cl.
| | | |
|---|---|---|
| *H01L 29/10* | (2006.01) | |
| *H01L 29/861* | (2006.01) | |
| *H01L 29/417* | (2006.01) | |
| *H01L 29/66* | (2006.01) | |
| *H01L 29/78* | (2006.01) | |

(52) U.S. Cl.
CPC ........ *H01L 29/861* (2013.01); *H01L 29/1095* (2013.01); *H01L 29/41766* (2013.01); *H01L 29/66734* (2013.01); *H01L 29/7813* (2013.01)

(58) Field of Classification Search
CPC ........... H01L 29/1095; H01L 29/41766; H01L 29/66734; H01L 29/7813; H01L 29/861
USPC ......................................................... 257/330
See application file for complete search history.

(56) References Cited

U.S. PATENT DOCUMENTS

| | | | |
|---|---|---|---|
| 5,326,711 A | 7/1994 | Malhi | |
| 5,637,898 A | 6/1997 | Baliga | |
| 6,979,861 B2 | 12/2005 | Rodov et al. | |
| 2009/0039419 A1 | 2/2009 | Zundel et al. | |
| 2009/0057757 A1* | 3/2009 | Hokomoto | H01L 29/7806 257/330 |
| 2009/0078962 A1 | 3/2009 | Ankoudinov et al. | |
| 2012/0326227 A1* | 12/2012 | Burke | H01L 29/7811 257/330 |
| 2013/0069147 A1 | 3/2013 | Ohta et al. | |
| 2015/0002719 A1* | 1/2015 | Isono | H01L 27/307 348/311 |
| 2016/0043144 A1* | 2/2016 | Sato | H01L 27/14636 438/59 |
| 2017/0288065 A1 | 10/2017 | Blair et al. | |

FOREIGN PATENT DOCUMENTS

WO 2005/031877 A1 4/2005

* cited by examiner

*Primary Examiner* — Long K Tran
(74) *Attorney, Agent, or Firm* — Seed IP Law Group LLP

(57) ABSTRACT

The present disclosure relates to a structure comprising, in a trench of a substrate, a first conductive region separated from the substrate by a first distance shorter than approximately 10 nm; and a second conductive region extending deeper than the first region.

20 Claims, 3 Drawing Sheets

DIODE STRUCTURE

BACKGROUND

Technical Field

The present disclosure generally relates to electronic circuits and, more specifically, to a diode structure.

Description of the Related Art

In certain applications, such as for example power electronics applications, it is desired to have diodes able to conduct in the forward direction currents of high values, for example, of more than 1 A, or even of more than 100 A, with the lowest possible voltage drop across the diode. It is further desired for the diode to conduct the lowest possible current when it is reverse-biased. It is further desired for the diode to be able to block the flowing of current for high reverse voltage values, for example, of more than 10 V, or even more than 100 V.

BRIEF SUMMARY

An embodiment provides overcoming all or part of the disadvantages of known diode structures.

An embodiment provides a structure enabling to obtain a diode having a maximum reverse voltage, or avalanche voltage, the forward voltage drop and/or the leakage current are improved with respect to known diodes.

Thus, an embodiment provides a structure comprising, in a trench of a substrate, a first conductive region separated from the substrate by a first distance shorter than approximately 10 nm; and a second conductive region extending deeper than the first region.

According to an embodiment, the second region is separated from the substrate by a second distance greater than the first distance.

According to an embodiment, the first region is separated from the substrate by a first dielectric layer and the second region is separated from the substrate by a second dielectric layer.

According to an embodiment, the substrate is semiconductor.

According to an embodiment, the structure comprises a conductive layer portion covering the substrate and the trench, said portion being electrically connected to the substrate and to the first and second regions.

According to an embodiment, said portion is in contact with the substrate or separated from the substrate by less than 300 nm.

An embodiment provides a diode comprising one or a plurality of the above-defined structure.

According to an embodiment, the diode is defined by one or a plurality of transistors having at least one channel region extending between two of the trenches, the first regions defining the transistor gates.

According to an embodiment, the diode comprises a contacting region electrically connecting the channel region to the conductive layer.

According to an embodiment, the first regions are semiconductor regions, the channel region and the first regions being doped with opposite conductivity types.

According to an embodiment, the diode comprises a drain region extending under the channel region between the two trenches and preferably under the trenches.

According to an embodiment, the drain region is less heavily doped than the channel region.

An embodiment provides a method of manufacturing the above-defined structure.

According to an embodiment, the method comprises forming the second dielectric layer on the walls and the bottom of the trench, and removing a portion of the second dielectric layer located at the location of the future first region.

According to an embodiment, the method comprises a step of thermal oxidation of walls of the trench delimiting the location of the future first region.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
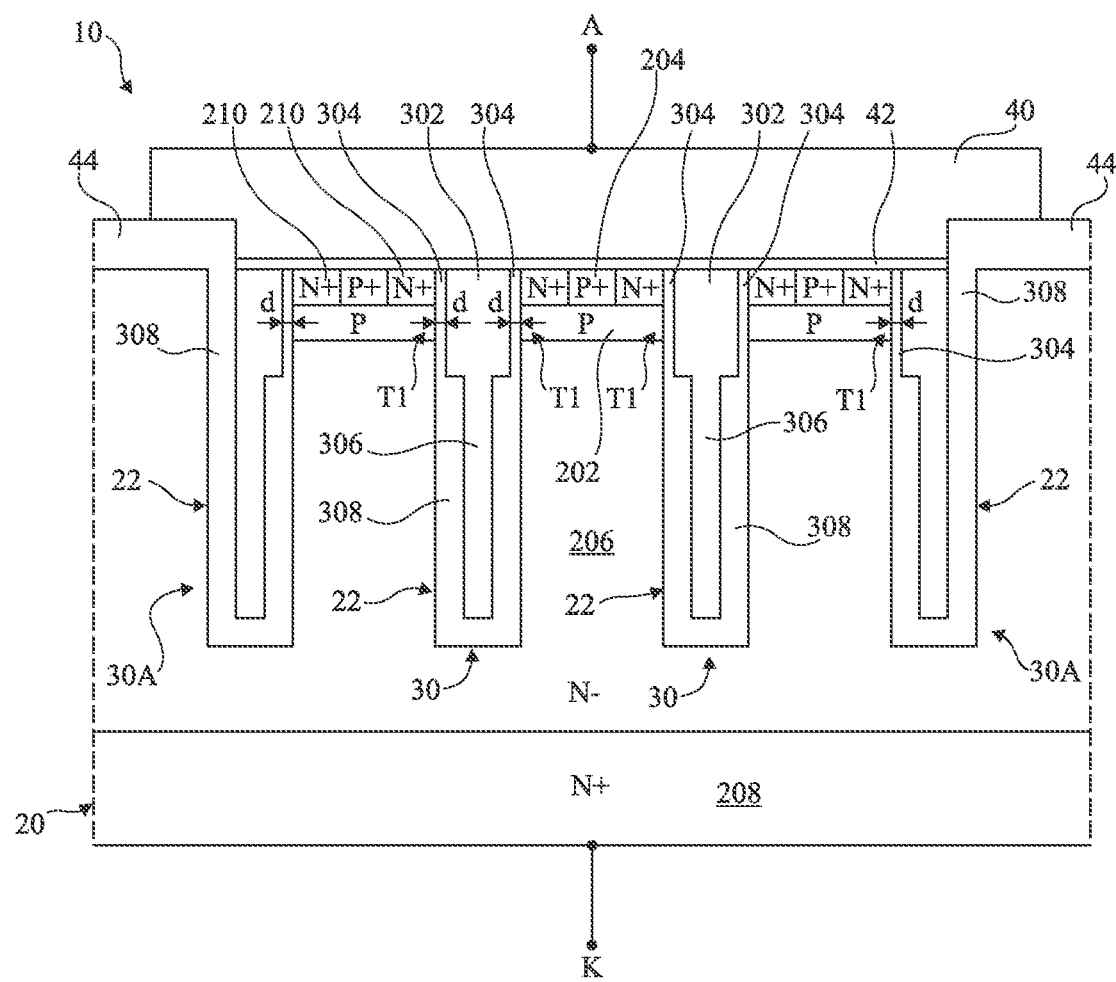
FIG. 1 is a simplified cross-section view illustrating an embodiment of a diode.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of concerned element in the drawings, it being understood that, in practice, the described devices may be oriented differently. Unless otherwise specified, expressions "about", "approximately", "substantially", and "in the order of" mean to within 10%, preferably to within 5%.

FIG. 1 is a simplified cross-section view illustrating an embodiment of a diode 10.

Diode 10 comprises a substrate 20, for example, made of a semiconductor such as silicon. The diode comprises a cathode terminal K, for example, electrically connected to a lower surface of the substrate, and an anode terminal A. Diode 10 comprises trenches 22. Trenches 22 extend in substrate 20 from the upper surface of the substrate. Trenches 22 are for example parallel to one another. Trenches 22 are for example regularly spaced apart. As a variation, trenches 22 are in the shape of concentric rings.

The diode comprises structures 30A, described hereafter, each located in a trench 22. The diode for example comprises two structures 30A on either side of the diode. Between structures 30A, the diode may further comprise one or a plurality of structures 30.

Each structure 30 comprises, in the concerned trench 22, an electrically-conductive region 302. Conductive region 302 is located in an upper portion of trench 22. Region 302 is separate from the walls of trench 22. Region 302 is for example separated from the walls by dielectric layers 304 arranged on either side of region 302. It will be understood that layers 304 may be portions of a same dielectric layer. Region 302 and the walls are separated by a short distance d, preferably smaller than 10 nm, for example smaller than 7 nm.

Each structure 30 further comprises an electrically-conductive region 306 extending in the trench lower than region 302. In the example illustrated in FIG. 1, region 306 extends from region 302. In other words, regions 302 and 306 are one piece. Region 306 is for example located farther away from the trench walls than region 302. Region 302 is for example separated from substrate 10 by a dielectric layer 308 covering the walls and the bottom of trench 22. The thickness of layer 308 is for example greater than approximately 100 nm, preferably in the range from 250 nm to 1000 nm.

Structures 30A comprise the same elements as structures 30. However, what matters is for the low distance d mentioned hereinabove to be absent on the outer sides of the diode. As an example, layer 308 then continues between region 302 and the trench wall on the outer side of the diode. Layer 308 may join an insulating layer 44 covering the substrate on the periphery of the diode.

As an example, regions 302 and 306 are made of doped polysilicon, and layers 304 and 308 are made of silicon oxide.

As discussed hereafter in the specific case of diode 10, the regions 302 and 306 thus obtained enable, when potentials are applied thereto, to exert different electrostatic influences on the substrate portions in contact with layers 304 and 308. In particular, the closer region 302 is to the substrate, the stronger the electrostatic influence on the substrate portion in contact with layer 304.

A transistor T1 can then be formed in the substrate portion in contact with each layer 304, the considered region 302 forming the transistor gate. As an example, transistors T1 have an N channel. Each transistor comprises a P-type doped channel region 202 (P). As an example, each channel region 202 extends between two neighboring trenches 22 and is thus common to two neighboring transistors T1. The channel regions are for example topped with contacting areas 204 (P+). Contacting areas 204 are more heavily P-type doped than channel regions 202.

Each transistor further comprises a drain region 206 (N−) located under the channel region. As an example, each drain region 206 extends between two neighboring trenches 22 and is common to the neighboring transistors T1. Drain regions 206 may extend under the trenches, and the drain regions may then join under the trenches. The drain regions are for example on top of and in contact with a contacting region 208 (N+) extending on the lower portion of the substrate. Region 208 is more heavily doped than drain regions 206. Region 208 is electrically connected to terminal K.

Each transistor further comprises a source region 210 (N+), preferably located against layer 304. Source region 210 is for example more heavily N-type doped than drain region 206.

When a transistor such as described hereinabove is in the on state, a vertical conductive channel located against layer 304 in channel region 202 connects the source region 210 to the drain region 206. The channel length of the transistor thus corresponds to the thickness of channel region 202. The implantation energies of the channel region 202 and the source region 210 are selected to obtain the desired channel length. As an example, the thickness of region 202 is in the range from 150 nm to 800 nm.

In diode 10, gate regions 302, source regions 210, and contacting regions 204 of transistors T1 are preferably electrically connected to anode terminal A. This enables the transistors to define diode 10. To achieve this, as an example, a conductive layer 40 covers substrate 20 and trenches 22. Layer 40 is for example made of aluminum, aluminum-copper or aluminum-silicon-copper. Layer 40 may rest on a conductive interface layer 42. Regions 302 extend in the trenches from layer 40 or the possible interface layer 42. Layer 42 is for example intended to ease the forming of electric contacts between the layer 40 and the regions 302, 204, 210, and possibly the region 306 (method of FIGS. 2A to 2F below). Layer 42 may be made of a silicide or may be a metal layer, for example, made of titanium. The layer 42 may alternatively comprise a silicide layer and a metal layer, the metal layer covering the silicide layer and for example being made of titanium. The silicide thus forms the electric contacts, whereas the metal layer provides adhesion of the layer 40. The layer 42 can be obtained at least partially by a self-aligned siliciding process, and the silicide is then discontinuous and does not cover the upper parts of the layer 304. The thickness of layer 42 is preferably smaller than 300 nm, for example smaller than 100 nm.

Due to the fact that regions 302 and channel regions 202 are separated by the above-mentioned short distance d, the doping level of channel regions 202 and the doping type and level of regions 302 may be selected to obtain for the diode a saturation current density at 25° C. for example between 1 nA/mm$^2$ and 1 mA/mm$^2$. Preferably, the doping level of the regions 202 is between $2 \times 10^{16}$ and $10^{18}$ atoms/cm$^3$. In order to obtain this saturation current density, the regions 302 are heavily N-type doped, for example at more than $5 \times 10^{18}$ atoms/cm$^3$, or more generally heavily doped by the conductivity type opposite to that of the channel regions 202. The current density saturation is here determined by: a) measurement of two points or more of the current density-voltage characteristic of the diode biased by a direct voltage greater than 0.1 V; and then b) obtaining an exponential function of the voltage, where this function passes through the two points or is the closest to the points if they are more than two. Then, the saturation current density is the value of the exponential function for a zero voltage. During the step a), the voltage value of each point of the characteristic is measured so that it does not substantially include, for example to within 1 mV, voltage drops in parasitic access resistances of the diode. The current density of each point corresponds to a value of a current flowing through the diode, divided by the surface area between the trenches in top view. In step b), the exponential function is preferably determined by minimizing the sum of the squares of the differences between the logarithms of the current densities and that of the exponential function.

When the diode is reverse biased, the electrostatic influence due to regions 306 through layer 308 enables to limit the electric field (that is, to decrease this field with respect to what it would be if regions 306 and layer 308 were not there) in the channel regions and in the drain regions. This limits the leakage current in the diode. Further, this enables to increase the avalanche voltage at a given doping level of the drain regions and/or to increase the doping level of the drain regions at a given avalanche voltage. An advantage of increasing the doping level of the drain regions is that the electric conductivity of the diode is all the greater as this doping level is high, and the voltage drop in the diode is thus limited when a current flows in the forward direction.

As an example, the drain regions have a doping level in the range from $3.10^{15}$ to $10^{17}$ atoms/cm$^3$. The channel regions have a doping level for example in the range from $2.10^{16}$ to $10^{18}$ atoms/cm$^3$. Further, the trenches are separated by distances for example in the range from 0.5 μm to 3.0 μm. The trenches penetrate into the substrate down to a level for example between 0.5 μm and 8 μm under the lower level of the channel regions.

FIGS. 2A to 2F illustrate successive steps of an implementation mode of a method of manufacturing a variation of a structure 30 of FIG. 1, using same elements as structure 30 of FIG. 1.

Figure 2A:
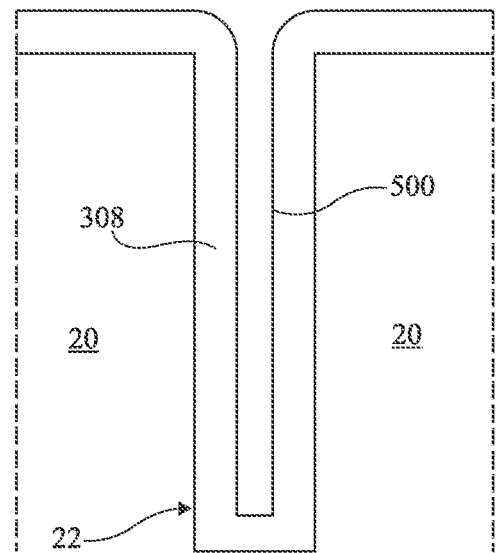
FIGS. 2A to 2F illustrate steps of an implementation mode of a method of manufacturing the diode of FIG. 1.

At the step of FIG. 2A, trench 22 is etched into the substrate. To achieve this, as an example, the substrate is covered with a masking layer, not shown, for example, made of silicon oxide. An opening is formed, for example, by lithography, into the masking layer above the location of the future trench, after which the trench is etched. The masking layer is then removed.

After this, a layer 308 is conformally formed, for example, by thermal oxidation of the trench walls and/or by deposition of a silicon oxide layer. Layer 308 covers the trench walls. Layer 308 may also cover substrate 20 outside of the trenches. The thickness of layer 308 is smaller than half the width of the trench, so that an opening 500 is kept at the center of the trench.

Figure 2B:
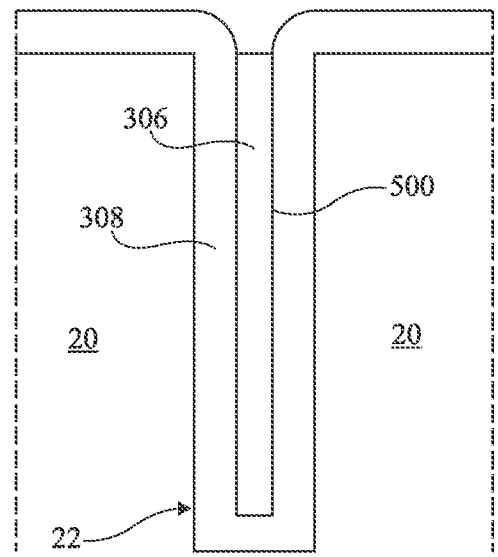

At the step of FIG. 2B, opening 500 is filled with the conductive material of region 306, for example, up to the upper level of the substrate or up to a level close to the upper level of the substrate. For this purpose, a conformal deposition of doped polysilicon is for example performed. The polysilicon is then etched down to the desired level. Region 306 is thus obtained.

Figure 2C:
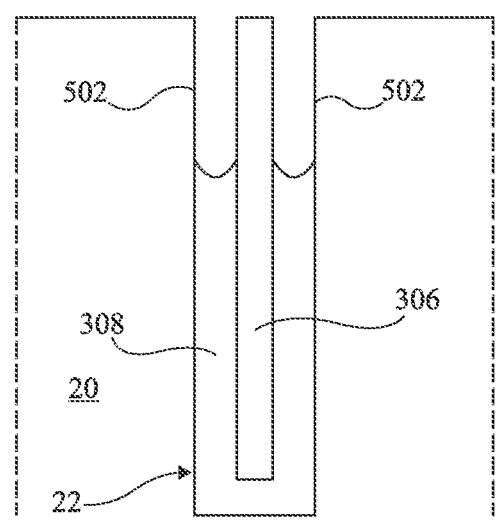

At the step of FIG. 2C, layer 308 is etched from the upper surface to the lower level of the future regions 302. As an example, the etching is chemically performed. Cavities 502 are thus obtained in the upper portion of the trench, on either side of region 306.

Figure 2D:
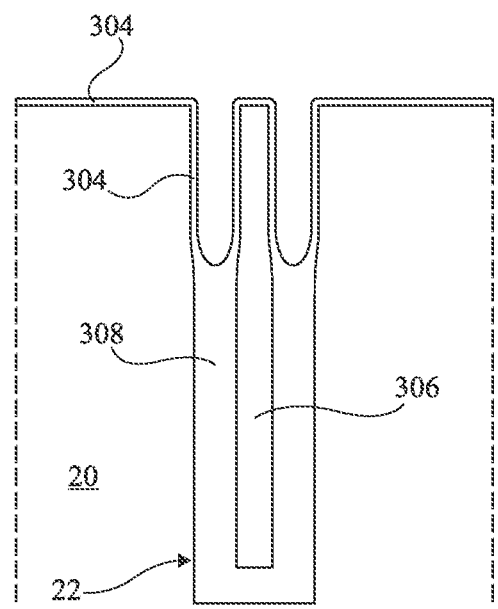

At the step of FIG. 2D, layer 304 is formed. For this purpose, as an example, the portions of the trench walls and of region 306 which have been made accessible at the step of FIG. 2C are thermally oxidized. The thermal oxide layer 304 thus formed on the walls of cavities 502 may be continued on the upper surfaces of the substrate and of region 306.

Figure 2E:
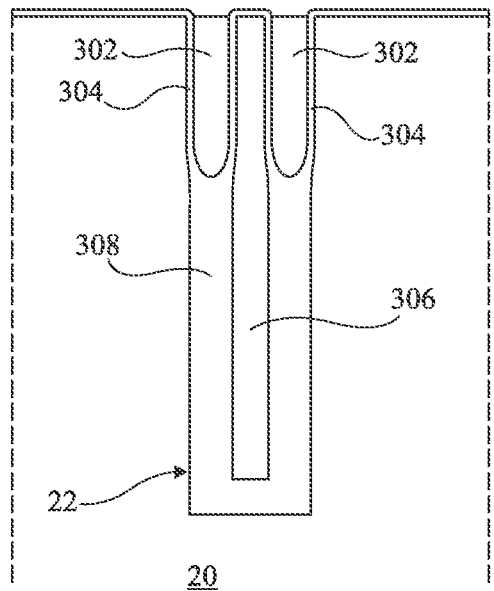

At the step of FIG. 2E, cavities 502 are filled, for example, up to the upper level of the substrate or up to a level close to the upper level of the substrate. For this purpose, a conformal deposition of doped polysilicon is for example performed. The polysilicon is then etched down to the desired level. Two regions 302 are thus obtained on either side of region 306.

Figure 2F:
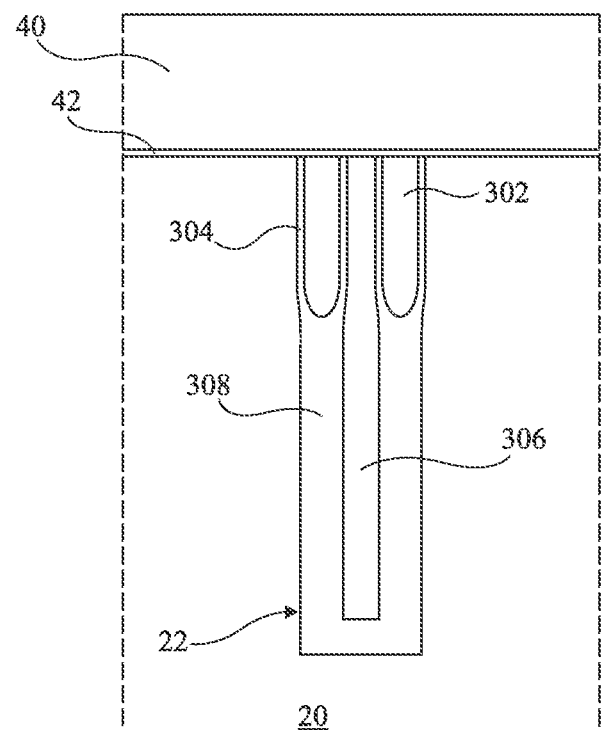

At the step of FIG. 2F, the possible elements located on the upper surface of the substrate and of regions 302 and 306, such as the accessible portions of layer 304, are removed. The possible layer 42 and layer 40 are then formed.

The variation of structure 30 obtained by the method of FIGS. 2A to 2F differs from structure 30 of FIG. 1 in that region 306 is separate from region 302 and extends all the way to layer 40 or to possible layer 42, and in that this variation comprises two regions 306 on either side of region 302. Each region 302 is in electric contact with layer 40. Each region 302 is separated from the substrate by a layer 304.

A structure 30A may be obtained by a method similar to the method of FIGS. 2A to 2F, where it is further provided, between the steps of FIGS. 2B and 2C, to form a masking layer which protects layer 308 located on a wall on a single side of trench 22, and to leave layer 308 exposed on the other side of the trench. A single cavity 502 is obtained at the step of FIG. 2C.

Specific embodiments have been described. Various alterations, modifications, and improvements will readily occur to those skilled in the art. In particular, structures 30 and 30A and their variations may be used in any electronic component using the electrostatic influence of a conductive region on a substrate through an insulator layer, for example, a transistor. Further, a single trench may be provided, with, for example, a transistor at least on one side.

Further, in the described embodiments, the N and P conduction types, the N and P channel types of the transistors, and the cathode and the anode of the diodes may be simultaneously inverted, Various embodiments with various variations have been described hereinabove. It should be noted that those skilled in the art may combine various elements of these various embodiments and variations.

Finally, the practical implementation of the described embodiments is within the abilities of those skilled in the art based on the functional indications given hereinabove.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A structure comprising:
    a substrate having a trench;
    a first conductive region in the trench and separated from the substrate by a first distance shorter than 10 nm; and
    a second conductive region in contact with the first conductive region the trench and extending deeper into the trench than the first conductive region.

2. The structure of claim 1, wherein the second conductive region is separated from the substrate by a second distance greater than the first distance.

3. The structure of claim 1, further comprising:
    a first dielectric layer separating the first conductive region from the substrate; and
    a second dielectric layer separating the second conductive region from the substrate.

4. The structure of claim 1, wherein the substrate is semiconductor.

5. The structure of claim 4, comprising a conductive layer covering the substrate and the trench, said conductive layer being electrically connected to the substrate and to the first and second conductive regions.

6. The structure of claim 5, wherein said conductive layer is in contact with the substrate or separated from the substrate by less than 300 nm.

7. A diode comprising:
    a substrate having a first trench that has a sidewall and a bottom surface;
    a cathode and an anode coupled to the substrate;
    a first conductive region in the trench and separated from the sidewall of the substrate by a first distance that is less than approximately 10 nm; and
    a second conductive region in the trench in contact with the first conductive region and extending closer to the bottom surface than the first conductive region.

8. The diode of claim 7, wherein the substrate includes a second trench, the diode further comprising:

at least one transistor having at least one channel region extending between the first and second trenches, the first conductive region defining a gate of the at least one transistor.

9. The diode of claim 8, comprising:
a conductive layer covering the substrate and the first and second trenches; and
a contacting region in the substrate and electrically coupling the channel region to the conductive layer.

10. The diode of claim 8, wherein the first and second conductive regions are semiconductor regions, the channel region and the first conductive regions being doped with opposite conductivity types.

11. The diode of claim 8, comprising a drain region extending under the channel region and between the first and second trenches.

12. The diode of claim 11, wherein the drain region is less heavily doped than the channel region.

13. The diode of claim 11, wherein the drain region extends under the first and second trenches.

14. A method, comprising:
forming a trench in a substrate;
forming a conductive material in the trench including:
    forming a first conductive region in the trench that is separated from the substrate by a first distance that is less than 10 nm; and
    forming a second conductive region in the trench and extending farther into the trench than the first conductive region.

15. The method of claim 14, comprising:
forming a first dielectric layer separating the first conductive region from the substrate; and
forming a second dielectric layer separating the second conductive region from the substrate, wherein forming the second dielectric layer includes forming the second dielectric layer on walls and a bottom of the trench and removing a portion of the second dielectric layer before forming the first conductive region at a location from which the portion of the second dielectric layer was removed.

16. The method of claim 15, comprising thermally oxidizing walls of the trench delimiting the location from which the portion of the second dielectric layer was removed.

17. A diode comprising:
a semiconductor substrate having a first trench;
a cathode and an anode coupled to the substrate;
a first vertical transistor in the substrate, the first vertical transistor including a first source region electrically coupled to the anode, a first gate extending vertically into the substrate and electrically coupled to the anode, a first drain region electrically coupled to the cathode, a first channel region between the first source and drain regions, and a first gate dielectric extending in the substrate and between the first gate and the first channel region,
a first conductive region in the trench and separated from the substrate by a first distance shorter than 10 nm; and
a second conductive region in contact with the first conductive region in the trench and extending deeper into the trench than the first conductive region.

18. The diode of claim 17, wherein the gate is the first conductive region that is separated from the first channel region by a first distance
and the second conductive region is separated from the drain region by a second distance that is greater than the first distance.

19. The diode of claim 17, further comprising:
a second vertical transistor in the substrate, the second vertical transistor including a second source region electrically coupled to the anode, a second gate extending vertically into the substrate and electrically coupled to the anode, a second drain region electrically coupled to the cathode, a second channel region between the second source and drain regions, and a second gate dielectric extending in the substrate and between the second gate and the second channel region.

20. The diode of claim 19, comprising:
a conductive layer covering the substrate and the first and second vertical transistors; and
a contacting region in the substrate and electrically coupling the first and second channel regions to the conductive layer.

* * * * *

UNITED STATES PATENT AND TRADEMARK OFFICE
CERTIFICATE OF CORRECTION

| | |
|---|---|
| PATENT NO. | : 11,239,376 B2 |
| APPLICATION NO. | : 16/584774 |
| DATED | : February 1, 2022 |
| INVENTOR(S) | : Frederic Lanois |

Page 1 of 1

It is certified that error appears in the above-identified patent and that said Letters Patent is hereby corrected as shown below:

In the Claims

Column 6, Claim 1, Line 37:
"region the" should read -- region in the --.

Column 6, Claim 7, Line 62:
"less than approximately 10 nm; and" should read -- less than 10 nm; and --.

Signed and Sealed this
Seventh Day of June, 2022

Katherine Kelly Vidal
*Director of the United States Patent and Trademark Office*